United States Patent [19]

Lindberg

[11] Patent Number: 4,605,833
[45] Date of Patent: Aug. 12, 1986

[54] LEAD BONDING OF INTEGRATED CIRCUIT CHIPS

[75] Inventor: Frank A. Lindberg, Baltimore, Md.

[73] Assignee: Westinghouse Electric Corp., Pittsburgh, Pa.

[21] Appl. No.: 589,912

[22] Filed: Mar. 15, 1984

[51] Int. Cl.[4] .............................................. B23K 31/00
[52] U.S. Cl. .............................. 219/56.22; 219/56.21; 219/86.51; 219/85 F; 228/179
[58] Field of Search .................. 219/56.21, 56.22, 109, 219/110, 86.51, 85 F; 228/179, 180 A

[56] References Cited

U.S. PATENT DOCUMENTS

| | | | |
|---|---|---|---|
| 3,574,923 | 4/1971 | Cushman | 228/180 A |
| 3,670,396 | 6/1972 | Lindberg | |
| 3,778,581 | 12/1973 | Denny | 219/85 F |
| 3,883,946 | 5/1975 | Dale | |
| 3,948,429 | 4/1976 | Davies et al. | |
| 4,340,166 | 7/1982 | Bilane et al. | 228/179 |
| 4,484,056 | 11/1984 | Russell | 219/86.51 |

OTHER PUBLICATIONS

The Western Electric Engineer, Jul. 1979, pp. 3–10, Part I—Thermo-Compression Bonding of Beam-Lead Chip Arrays to Interconnect Circuitry on Ceramic Substrates by John A. Boyer and John A. Burns.

*Primary Examiner*—Clifford C. Shaw
*Attorney, Agent, or Firm*—H. W. Patterson

[57] ABSTRACT

A method and apparatus for bonding a plurality of metallic leads to pads of a chip where the force of a thermode, which is placed in contact with the chip is increased at a first rate to a maximum force less than required to effect the bonding over a time period required to bring the metallic leads and pads close to bonding temperature, and then increasing the uniform force at a rate greater than the first rate to a force sufficient to effect the bonding. The apparatus includes a chip holder arrangement that is mounted to automatically align to the plane of the bonding thermode to provide for uniform deformities to the bump portions of the bond.

6 Claims, 10 Drawing Figures

LEAD BONDING OF INTEGRATED CIRCUIT CHIPS

BACKGROUND OF THE INVENTION

1. Field of the Invention

The present invention relates to the bonding of metallic leads to pads of integrated circuit chips, and more particularly to an improved method and apparatus that applies force at different rates over predetermined periods of time to minimize chip fracture.

2. Description of the Prior Art

Heretofore, lead frames were bonded to metallic pads of integrated circuit chips by bringing a pre-heated thermode into contact with the leads, and rapidly increasing the contact force of the thermode until the bonding pressure is attained. This prior art method may be carried out by apparatus 10 schematically illustrated in FIG. 1 which includes a bonding thermode 11 supported by a small cylinder 12 that is fitted with a diaphragm 13. Above the diaphragm 13 is a chamber 14 that is under air pressure P2 supplied by line 15 through a pressure regulator 16. The cylinder 12 is supported by a larger cylinder 17 by way of a diaphragm mounted piston rod 18, above which is an air chamber 19. The air pressure for the chamber 19 is supplied at the inlet 15 to a pressure regulator 20 that is set at a pressure P1. The air is admitted to the chamber 19 through a solenoid valve 21 and an adjustable orifice 22. The regulator 20 and the adjustable orifice 22 provide some degree of control over the speed at which the small cylinder 12 is pushed downwardly to place the thermode 11 into force contact with the lead frame 23, which is in alignment with an integrated circuit chip 24.

To carry out the bonding sequence of the prior art, an operator activates the solenoid valve 21 causing air pressure from the inlet 15, the regulator 20 and the orifice 22 to force the thermode 11 to contact the lead frame 23. When this contact occurs, the motion of the diaphragm 13 and thermode 11 stops. However, the cylinder 12 moves slightly relative to the thermode 11 to operate a switch 25 that starts a timer 26. At the expiration of a predetermined length of time, sufficient to effect the bonding, the timer 26 operates the solenoid valve 21 to release the air pressure from the chamber 19 by way of vent 27. As a consequence, the small cylinder 12 carrying the thermode 11 is pulled upwardly away from the chip 24 by the springs 28 in preparation for the bonding of another chip.

As shown in the prior art drawing of FIG. 1, the leads of the frame 23 may have raised bumps 30 which align with the bonding pads 31 of the chip 24. The leads 23 and bumps 30 may be typically made of gold plated copper and the bonding pads 31 may be aluminum. The temperature of the thermode 11 is controlled to be high enough to anneal the bumps so they can deform slightly, and evenly distribute the bonding pressure over the interface between the bumps 30 and pads 31, in an attempt to prevent fractures in the chip 24 under the pads 31.

The contacting of the lead frame 23 by the thermode 11 causes the temperature of the lead frame 23 and chip 24 to increase as a function of time. The operation of the apparatus 10 causes the pressure of the interface between the leads 23 and bonding pads 31 also to increase as a function of time. As a result, the compliant mass of metal anneals and the gold plate of the bump 30 forms an alloy with the aluminum pad 31 to create a bond between the two.

The mechanical force applied to the lead frame 23 is preferably sufficient to compress or deform the bumps approximately $2 \times 10^{-4}$ of an inch. Each of the bumps 30 should receive the same degree of deformation with a tolerance of not more than $1 \times 10^{-4}$ of an inch. However, to accomplish such a precise bonding force, it is required also that the surface supporting the chip and the abutting surface of the thermode be parallel.

The method and apparatus of the prior art previously described is adequate to effect satisfactory bonds for the most part, but during the bonding process, the pressure at the interface (leads 30 and pads 31) tends to increase to the extent that full bonding pressure is reached before annealing temperature, resulting in a high incidence of chip fracture. Also, a slight misalignment of the apparatus causes insufficient bonding pressure at one side of the frame 23, and too much pressure at the other side, resulting in non-uniform deformation of the bumps. It would appear obvious that the problem of chip fracture could be overcome merely by increasing the temperature of the thermode 11, so that the chip reaches annealing temperature prior to or at the time the thermode reaches full bonding pressure. However, as is the case with too great a pressure before optimum temperature is reached, too high a temperature also results in chip fracture. Another solution involved preheating the chip on a hot plate prior to bonding, but this accelerates the formation of aluminum oxide before bonding which is undesirable.

Therefore, it is desirable to provide an improved method and apparatus for gang bonding lead frames to integrated circuit chip pads that results in improved joints, and does not cause a high incidence of chip fracture.

SUMMARY OF THE INVENTION

In accordance with the present invention, a method and apparatus to bond the leads of a lead frame to respective pads of an integrated circuit chip is provided by controlling the pressure versus time relationship such that annealing temperature is reached before the full force of the thermode is reached, without excessive heating. The apparatus also includes a chip carrier assembly that provides for the application of uniform pressure to the leads of a lead frame.

More specifically, the method provides for initially moving the heated thermode into contact with the lead frame with minimal force then preheating the chip by increasing, at a first selected rate the force of the thermode to a selected maximum that is insufficient to deform the bumps. The first selected rate, which is a function of the temperature response of the chip to the heat of the thermode, increases the temperature of the chip sufficiently to avoid thermal shock during the actual bonding. Then the force of the thermode is increased at a second selected rate, which is greater than the first rate to a predetermined maximum force sufficient to effect the bonding. The second rate of pressure increases is selected as a function of the maximum desired dwell time.

In one specific aspect the chip carrier of the apparatus is supported pivotally at a point aligned with the approximate central point on the abutting surface of the thermode. The apparatus also includes provision for measuring the force applied to and the temperature of the chip as well as detecting any fracture thereof.

DESCRIPTION OF THE PREFERRED EMBODIMENT

Figure 1:
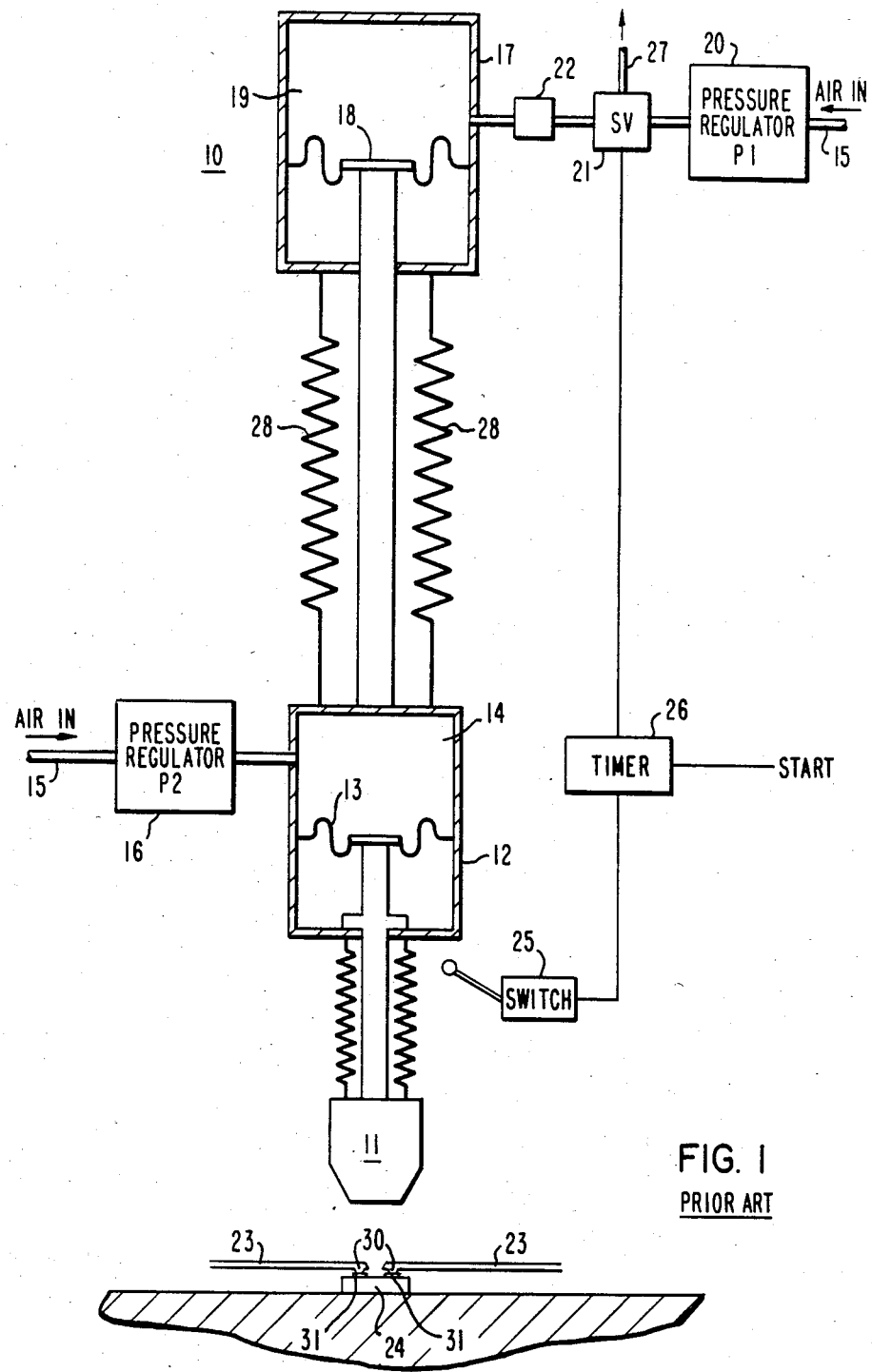
FIG. 1 is a schematic block diagram of prior art apparatus for bonding leads to pads of an integrated circuit chip.
Figure 2:
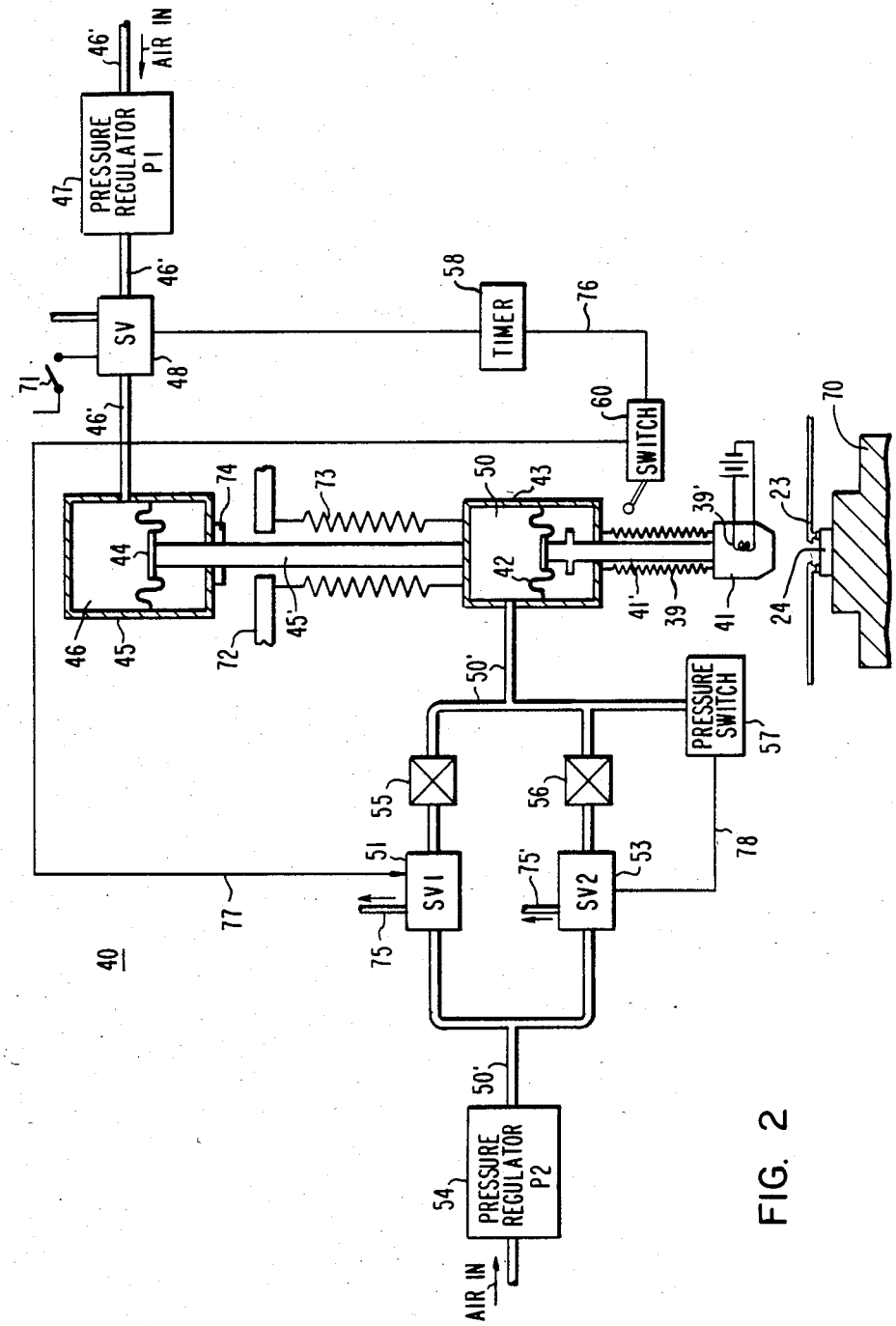
FIG. 2 is a schematic block diagram of apparatus for bonding leads to the pads of an integrated circuit chip according to the present invention.

Referring to FIG. 2, the apparatus for carrying out the method according to the present invention is generally referred to at 40. A thermode 41 is attached by a rod 41' to diaphragm 42 that is mounted in a small cylinder 43. The thermode 41 may be heated to the desired temperature by any conventional means including a resistance element 39' connected to a source of power. Also, the cylinder 43 has a rod 45' attached thereto, that is connected to a flexible diaphragm 44 fitted in a larger cylinder 45 similar to FIG. 1. Air pressure is supplied to chamber 46 above the diaphragm 44 in the cylinder 45 by way of a tube 46' from an air supply through a first pressure regulator 47 and solenoid valve 48. Air pressure is supplied to a chamber 50 above the diaphragm 42 in the cylinder by way of a tube 50' either from a solenoid valve 51 or a solenoid valve 53, which are connected in parallel with the air supply through a second pressure regulator 54. A first adjustable orifice 55 is connected downstream of and in series with the solenoid valve 51, and a second adjustable orifice 56 is connected downstream of and in series with the solenoid valve 53. A pressure switch 57, which is commonly connected to the adjustable orifices 55 and 56, and the chamber 50 through the tube 50' senses the pressure in the chamber 50 to control the solenoid valve 53 for introducing air through the orifice 56. A timer 58 is controlled by a contact switch 60 to close the solenoid valve 48 after a predetermined time period, and to open the solenoid valve 51 to introduce air into the chamber 50 of the cylinder 42. A chip carrier 70, aligned beneath the thermode 41, supports a chip, such as 24, to which a lead frame 23 is to be bonded. A similar result is obtained by the switch 57 starting the timer 58, which, after the time period expires, terminates the bond cycle.

Figure 5:
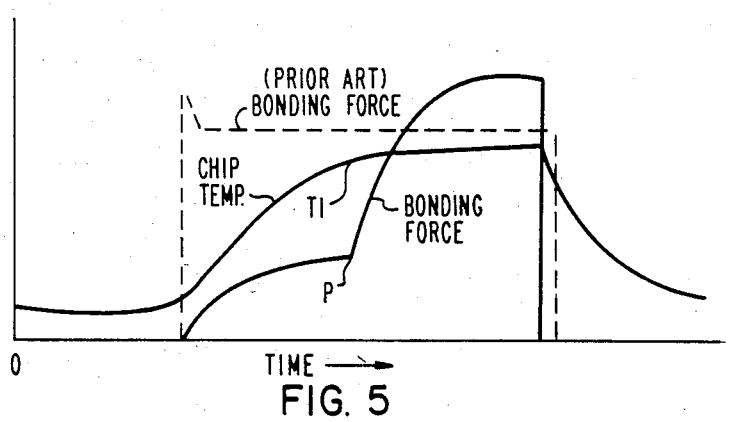
FIG. 5 is a graphical comparison of the pressure vs. time to which a chip is subjected during bonding according to the prior art and the pressure vs. time according to the method of the present invention.

In operation, and again referring to FIG. 2, a switch such as 71 is operated initially, which opens the solenoid valve 48 to introduce air into the chamber 46 through the pressure regulator 47 to force the diaphragm 44 downwardly against the pressure of springs 73 until an abutment such as 72 is engaged by projections 74 on the rod 45' attached to the cylinder 43. The travel of the cylinder 43 is slightly less than that required to place the thermode 41 in physical contact with the lead frame 23 and chip 24. At this point in the bonding process, the chamber 50 communicates with the atmosphere through vents 75 and 75' of the valves 51 and 53. Thus the thermode is held retracted relative to cylinder 43 by the springs 39. As the cylinder 43 travels downwardly at the beginning of the bonding sequence, it trips the switch 60 which starts the timer 58 by way of a wire 76, and opens the solenoid valve 51 by way of wire 77, and closes vents 75 and 75'. This opening of the valve 51 causes air to be introduced through the adjustable orifice 55 and into the chamber 50 above the diaphragm 42 from the pressure regulator 54. The regulator 54 determines the maximum pressure available for the chamber 50, and the size of the orifice 55 determines the rate of increase of pressure in the chamber 50. Thus, the force initially applied by the thermode 41 results from the slow buildup of pressure in chamber 50 which slowly pushes the thermode 41 downward against the force of the return springs 39. This force is then increased at a first predetermined rate until a first maximum pressure is reached that is less than that required to deform the bumps on the leads. When this first pressure is sensed by the switch 57, it causes the solenoid valve 53 to open by way of wire 78 which permits air to enter the chamber 50 through the adjustable orifice 56 at a rate greater than the first rate to increase further the force of the thermode 41 against the lead frame 23 sufficient to effect the proper bonding. As previously mentioned, the orifice 55 controls the first rate and thus the time that the thermode engages the lead frame while reaching the first predetermined pressure, and the orifice 56 being opened in addition to 51 controls the second rate, and thus the time required to increase the force to that required to bond the lead frame 23 to the chip 24. Referring to FIG. 5 which is exaggerated for illustration purposes, the appropriately labeled dashed line shows the force of the thermode 41 against the chip according to the prior art, while the appropriately labeled solid line illustrates the force of the thermode according to the present invention. Assuming that point T1 is the annealing temperature of the lead, it is illustrated that the full bonding force is not applied until the annealing temperature is reached, and then at a faster rate than the initial application of force prior to point P.

Bonding machines that gang bond lead frames to integrated circuit chips by thermocompression bonding do so by applying a mechanical force to all of the bonds simultaneously with a preheated flat thermode as shown in FIG. 1. The chip or the leads of the lead frame have soft metal bumps made of gold or copper about 0.001 inch high. These bumps are deformed slightly by the thermode when the bonding is done. It is important that all of the bumps receive the same amount of deformation, about 0.0002 inch. This means that the surface of the chip platform and the surface of the thermode must be very parallel so that none of the bumps are deformed more than 0.0001 inch more than any other. It is extremely difficult to make, maintain, and measure this adjustment. An out of alignment condition causes the bumps on the one side of the chip to get too much bonding force and the ones on the other not enough.

Figure 3:
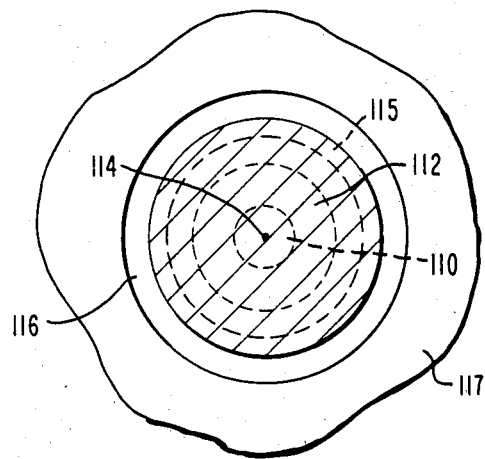
FIG. 3 is an enlarged plan view of a chip carrying assembly that may be used with the apparatus of FIG. 2.
Figure 4:
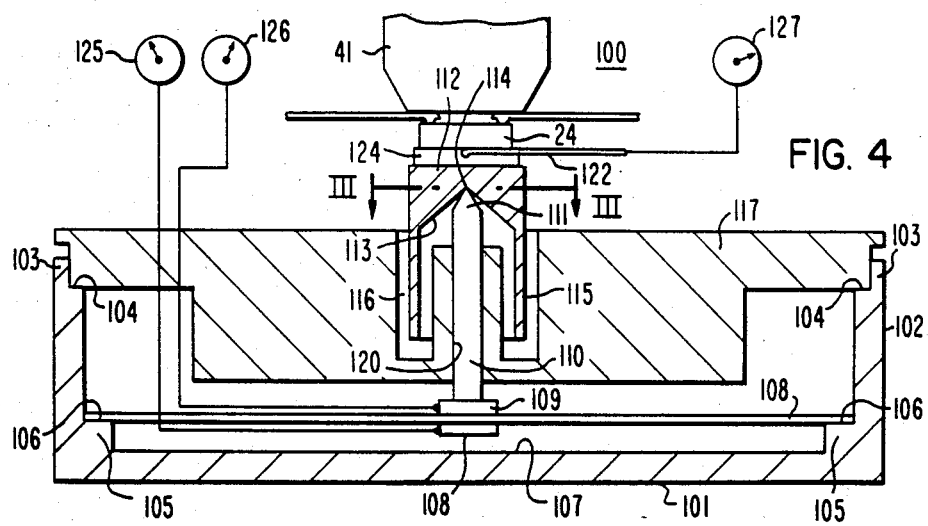
FIG. 4 is an enlarged sectional view of the chip carrying assembly of FIG. 3 illustrating fragmentally a thermode and leads in position thereon.

In place of the chip carrier 70, the apparatus 40 of FIG. 2 may include the chip carrier 100 as shown in FIGS. 3 and 4, that includes a base member 101 having a peripheral wall 102. The wall 102 at its outer edge has a portion 103 of reduced thickness to form a continuous shoulder 104. Near the base of the wall 102 is a continuous portion 105 of increased thickness to form a peripheral shoulder 106 axially spaced from an interior bottom surface 107. Supported by the shoulder 106 is a disc 108 conventionally equipped with a strain gauge in a well-known manner.

Mounted at the center of the disc 108 is a conventional high frequency acoustic emission detector 109 which supports centrally thereon and in the center of the disc 108 a pushrod 110 that has a pointed outer or upper end 111. The chip platform 112 has a cone shaped hole 113 which engages with the pointed end 111 of the pushrod 110. The chip platform 112 has enough mass located below the pivot point 114 so that its nominal position will be upright as shown in FIG. 4. The mass of the platform 112 is provided by an elongated metallic skirt portion 115 integral with the upper portion of the platform. The chip platform and skirt is preferably made of a single piece of a ferrous metal. The skirt 115 extends into a corresponding annular slot 116 formed in member 117 of the base portion generally referred to at 102. The member 117 has a central opening 120 through which the pushrod 110 slidably fits. The base member 102 supports the member 117 by the peripheral shoulder 104.

The strain gauge equipped metal disc 108 which supports the chip platform 112 by way of the pushrod 110 permits the dynamic measuring of the force on the thermode 41 which causes the push rod to move relative to the member 117 to place a strain on the disc 108. In the event such force should cause a chip to crack, it could be detected by the high frequency acoustic emission detector 109. The temperature of the chip may be measured by a thermocouple 122 inserted in the contact surface of a polyamide layer 124 upon which the chip rests. Thus, the chip carrying assembly provides for automatic planarity adjustment as well as dynamic measurement of temperature force and fracture detection for improved process control. The detectors 108, 109 and 122 may be conventional apparatus, with conventional indicators 125, 126 and 127.

Figure 6:
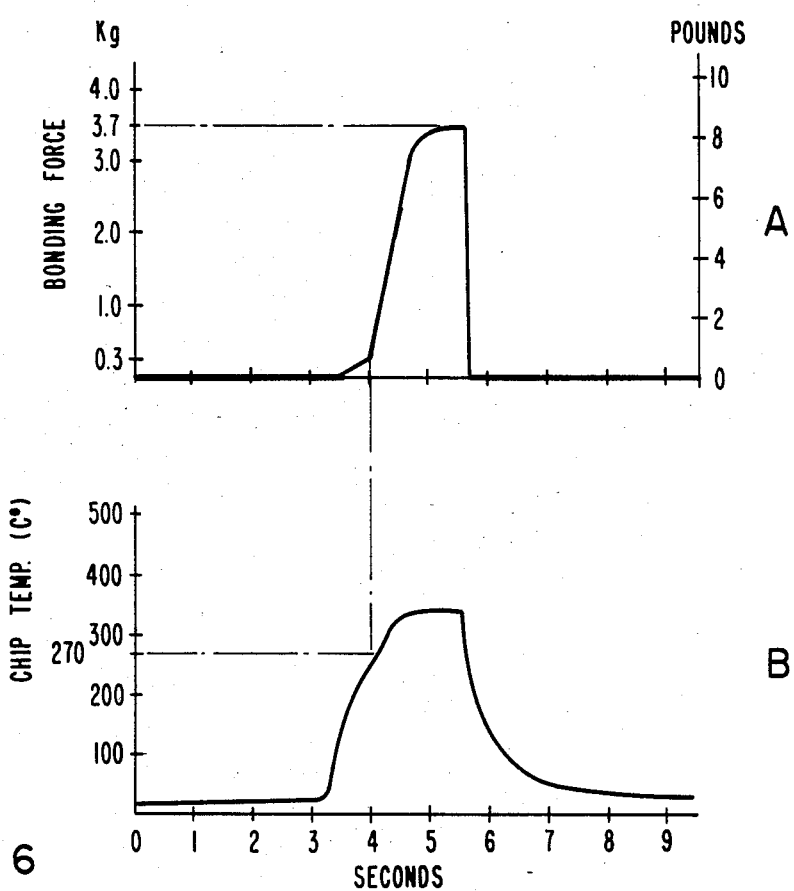
FIG. 6 is a graphical illustration of a typical bonding cycle in accordance with the present invention.

In actual practice, a 25 micrometer thermocouple was embedded in the top layer of the polyamide layer 124, which is one hundred, twenty-five micrometers thick. The thermal resistance of the polyimide layer 124 is about 140 times greater than the silicon so the temperature of the thermocouple 122 is close to that of the top surface of the chip 24. In any case, the bonding results were referenced to this temperature rather than the thermode temperature setting since this thermocouple temperature is much closer to the actual chip temperature. As shown in FIG. 6, which is a copy of a strip chart recording of the temperature and force, it can be seen that the initial application of a small amount of bonding force (0.3 Kg over 0.5 sec. in this example) results in a large temperature increase (270° C.). The application of the full bonding force (3.7 kg) causes the temperature to increase to its final peak value (340° C.). At the completion of the application of the force at the first rate, the temperature of the chip is in the neighborhood of 80% of the final temperature. The temperature increase is approximately 230 degrees C. per second.

Figure 7:
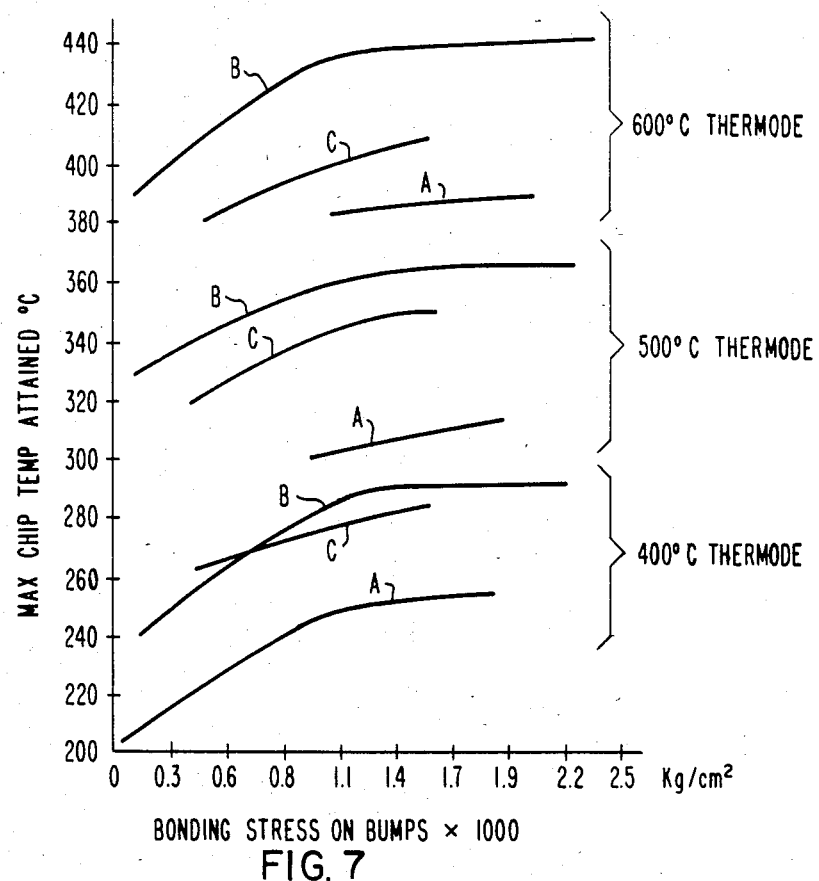
FIG. 7 illustrates various maximum chip temperatures attained as a function of bonding pressure (stress)

The maximum chip temperature attained is a critical parameter in thermocompression bonding. It depends not only on the thermode temperature but also on the chip size, lead count, and the compressive bonding stress placed on the bonding bumps. FIG. 7 shows the maximum chip temperature attained for three different combinations of chip sizes and lead counts. These maximum temperature values were obtained from three different thermode temperature settings as illustrated. Bonding these three chips with the same thermode temperature setting yields chip to chip temperature variations as high as 60° C. Thus machine settings which yield good results with one chip type do not necessarily work with another chip and tape combination since each tape design has a different heat sinking effect. The lines labeled A represent the maximum temperatures a 6 MM×6 MM chip with 15 leads; the lines labeled B represent such temperatures for 3.5 MM by 5 MM chips with 15 leads; and those labeled C are for 6 MM by 6 MM chips with 64 leads.

Figure 8:
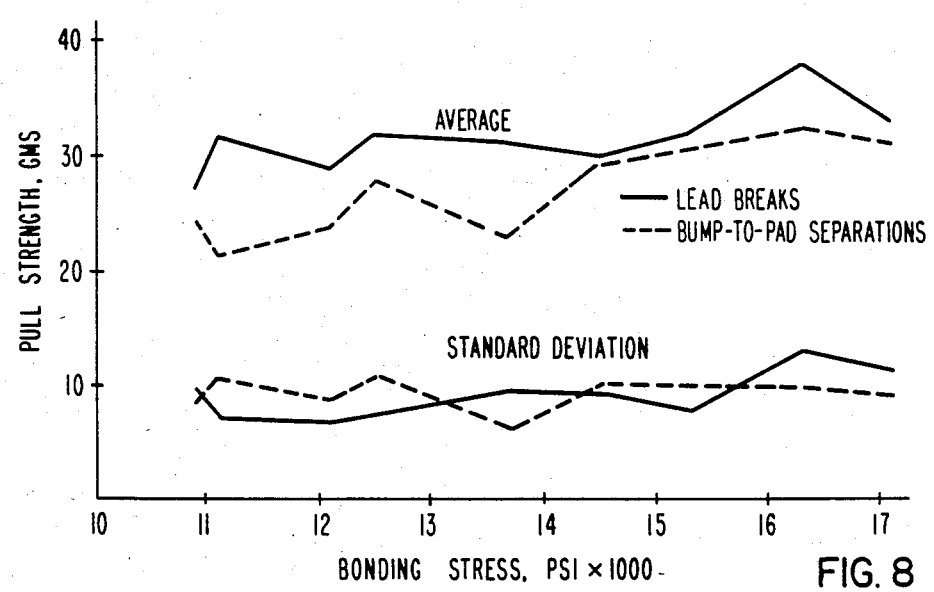
FIG. 8 illustrates graphically the average pull strength of various leads as a function of bonding pressure.
Figure 9:
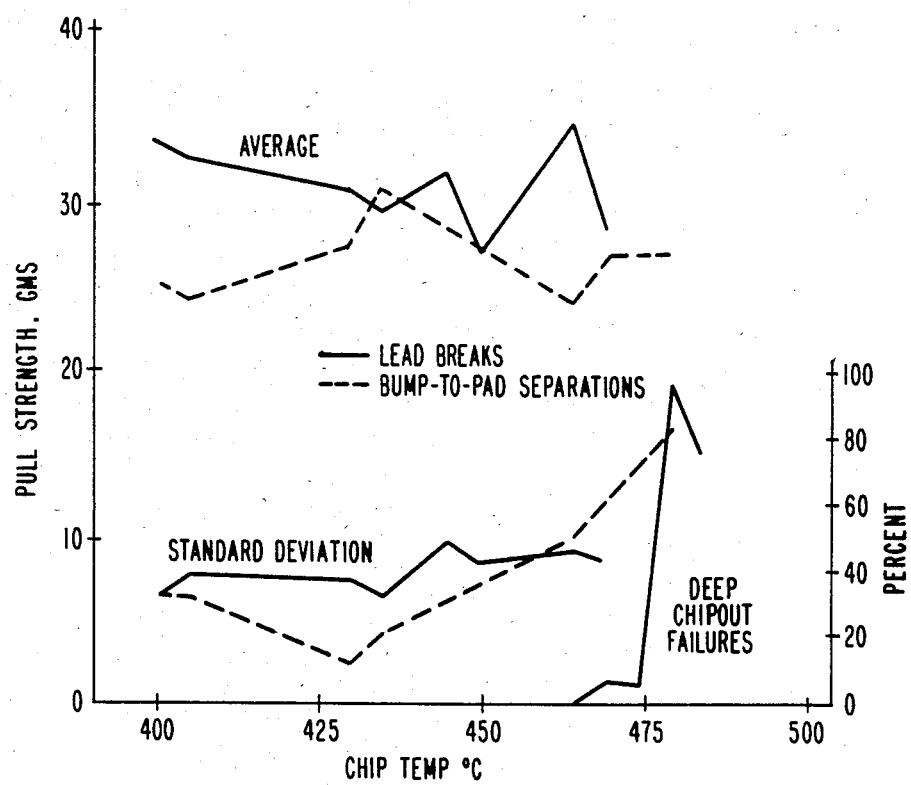
FIG. 9 illustrates graphically the average pull strength and percentage of deep silicon fractures as a function of bonding temperature.
Figure 10:
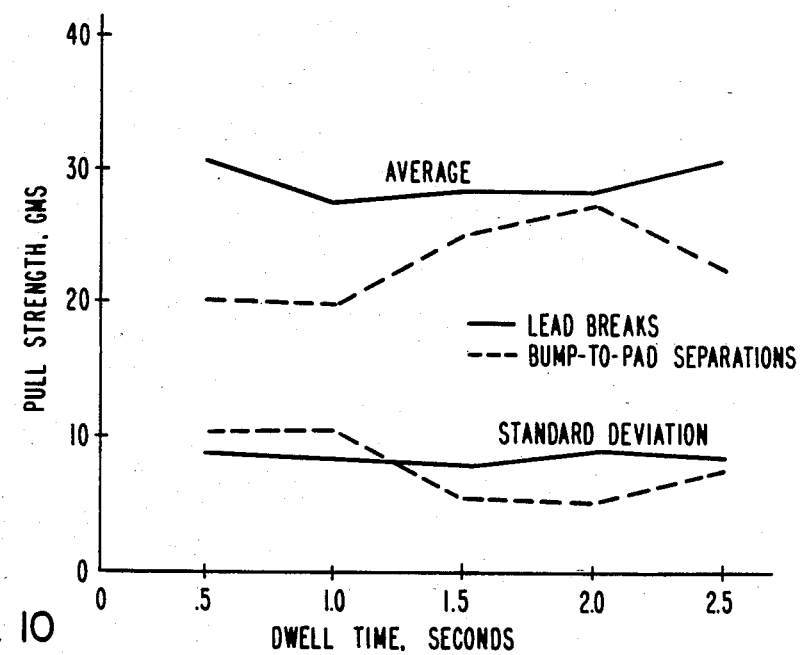
FIG. 10 illustrates graphically the average pull strength as a function of dwell time.

Experience and observations will dictate a reasonable starting point for the values of the bonding parameters of temperature, pressure, and time in order to determine the optimum bonding parameters for a given chip size, lead count, copper type, and bump size. For example, one procedure involved bonding three lots of ten chips having 54 leads per chip. In each lot of 10 chips two of the variables were held constant and the third was varied. All 540 leads were then destructively pulled and the breaking force was recorded for each lead. The failure modes were predominantly of three types, either lead breaks or separations between the bump and aluminum or between the aluminum and silicon. The failures of the latter two types revealed the bond spot size and afforded the opportunity to calculate the compressive bonding stress. In this example, the yield strength of the copper was not exceeded. The average pull strengths and standard deviations were plotted as a function of bonding compressive stress (pressure), chip temperature, and dwell time as shown in FIGS. 8, 9 and 10. In each figure the solid line represents lead breaks and the dashed lines indicate bump-to-pad separations. FIG. 8 shows a gradual increase in pull strength of the bump-to-pad failure mode as the bonding pressure increases. At a bonding pressure less than about 1100 kb/sq. cm., the bump-to-pad bond strength was slightly less than the lead break strength. Above 1100 kg/sq. cm., they are roughly equivalent. The lead pull strength should be independent of the bonding pressure. The reason that the average lead pull strength apparently increases is because the leads associated with the bump separation failures below 1100 kg/sq. cm. did not have the opportunity to break and thereby did not raise the lead break average pull strength.

FIG. 9 shows pull strength plotted against the measured maximum bonding temperature. A local maximum in bump-to-pad separation strength occurs between 425° and 450° C. Higher temperatures produce weaker bonds and at a temperature of 480° C. the occurrence of deep chipouts abruptly increases to nearly 100%. These chipouts may be caused by the thermal shock associated with the cool down part of the thermocompression bonding cycle. Since the optimum bonding temperature is below this danger point there is little need to retract the bonding thermode slowly to reduce this thermal shock.

FIG. 10 shows the pull strengths as a function of dwell time. The optimum appears to be 1.5 or 2 seconds but dwell times as short as 0.5 seconds appear to be acceptable as well. For this particular combination of chip type, lead count, bump size and copper type the optimum bonding parameters are: a measured chip temperature of 445° C. (measured under the chip), a bonding pressure (compressive bonding stress) of 15,000 to 17,000 PSI and a dwell time of 1 to 2 seconds.

The thermocompression bonding of gold plated copper bumped tape to standard aluminum bonding pads, for example, takes place at a temperature where the compressive yield strength of the copper is strongly temperature dependent. The copper loses about 14 kg/sq. cm. of yield strength per degree centigrade. The actual temperature that the copper reaches depends not only on the thermode set temperature but also on the thermode material, the thermode design, the chip size, lead count, the heat sinking effect of the chip platform, and the compressive stress applied to the bumps during bonding. Greater bonding pressure produces higher chip temperatures. In light of this, it is impractical to speculate what the thermode temperature setting should be for a given bonding task. The bonding machine must be instrumented so that a record can be made of the bonding force and chip temperature response for each bond so they can be compared to the limits established for the particular bonding task. The optimum bonding pressure, as determined by pull test results, occurs at a copper compressive stress which is lower than the yield stress for copper at the bonding temperature. This means that the copper bumps should not be called upon to provide compensation for an out-of-parallel condition between the chip platform and the bonding thermode.

Each combination of chip and tape should be evaluated to determine the optimum bonding. The values for temperature and pressure should be measurements indicative of what the chip actually experiences rather than machine settings. Thus, a bonding machine equipped with instrumentation so that each bond can be verified as to its conformance with the established bonding window for that particular chip and tape combination is desirable.

Although the present invention describes a system in accordance with one embodiment thereof it is understood that various modifications to its organization in order to practice the method claimed without departing from the spirit or scope of the invention as set forth in the appended claims.

I claim:

1. A method of gang bonding metallic leads to metallic pads of an integrated circuit chip to minimize chip fracture, comprising the steps of
   placing the leads and pads in bonding position beneath a thermode, said thermode being at a selected temperature above the actual bonding temperature of the metallic leads and pads, and said leads and pads being substantially at ambient temperature,
   placing the thermode in physical contact with the leads,
   increasing at a first selected rate the contact force of the thermode to a selected maximum force less than that required to effect the bond, said first rate being selected as a function of the temperature response of the chip to the thermode to raise the temperature of the leads and pads to a selected fraction of the bonding temperature,
   increasing at a second selected rate that is substantially greater than the first selected rate the contact force of the thermode to a maximum pressure sufficient to effect the bond, and
   withdrawing the thermode out of physical contact with the bonded leads and pads after a predetermined length of time sufficient to effect the bond.

2. A method according to claim 1 wherein the first rate is selected to raise the temperature of the chip to approximately 80% of its maximum temperature prior to the application of the force at the second selected rate.

3. An apparatus for gang bonding metallic leads to metallic pads of an integrated circuit chip, comprising
   a thermode having a plane surface for physically contacting the leads to be bonded
   a chip carrier assembly including a platform having a surface for supporting the chip to be bonded, a compliant insulating member mounted on the surface of the platform, said insulating member having a plane outer surface and a thermocouple mounted on said plane outer surface to detect the temperature of chip mounted thereon
   a means for pivotally mounting the platform in position to cause the thermode to apply uniform force to a chip supported by the platform surface at times when the thermode is in forceful contact with the chip positioned substantially centrally over the pivotal means,
   first means connected to the thermode operative to place the thermode in physical engagement with a chip on the plane surface of the carrier,
   second means for increasing the force of the thermode at a first selected rate to a selected maximum insufficient to effect the bond, third means to select said rate as a function of the temperature response of the chip to the thermode to raise the temperature of the leads and pads to a selected fraction of the bonding temperature and
   fourth means for increasing the force of the thermode at a second rate to a selected maximum to effect the bond.

4. An apparatus according to claim 3 wherein the platform of the chip carrier assembly includes a centrally positioned conical recess in the surface opposite the surface for supporting the chip and wherein the means for pivotally mounting the platform comprises a vertically mounted rod having a pointed end engaging the platform in the conical recess,
   said assembly comprising a base member having a peripheral shoulder, a strainable member mounted at its edges on the shoulder, said vertical rod being mounted at its other end on said strainable member centrally of its edges, and a strain gauge to measure the force of the thermode against the platform.

5. An apparatus according to claim 3 further comprising means mounted on the chip carrier assembly to detect the cracking of a chip during bonding.

6. In a method of gang bonding metallic leads to pads of an integrated circuit chip by compressing the leads and pads of the chip with a heated thermode, the improvement of placing the heated thermode in physical contact with the leads and pads that are at ambient temperature, and increasing the force of the thermode against the leads with at least two different rates of force sequentially, the first applied increase being at a lower rate than a subsequent applied increase said first rate of increase being selected as a function of the temperature response of the chip to the thermode to raise the temperature of the leads and pads to a selected fraction of the bonding temperature, and said subsequent rate being selected to effect the bond, thereby minimizing chip fracture.

* * * * *